United States Patent
Chang et al.

(10) Patent No.: US 11,721,381 B2
(45) Date of Patent: Aug. 8, 2023

(54) PERFORMING REFRESH OPERATIONS OF A MEMORY DEVICE ACCORDING TO A DYNAMIC REFRESH FREQUENCY

(71) Applicant: MICRON TECHNOLOGY, INC., Boise, ID (US)

(72) Inventors: Li-Te Chang, San Jose, CA (US); Murong Lang, San Jose, CA (US); Zhongguang Xu, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/393,020

(22) Filed: Aug. 3, 2021

(65) Prior Publication Data
US 2023/0043091 A1 Feb. 9, 2023

(51) Int. Cl.
  *G11C 11/406* (2006.01)
  *G11C 11/4096* (2006.01)
  *G11C 11/4074* (2006.01)

(52) U.S. Cl.
  CPC ..... *G11C 11/40611* (2013.01); *G11C 11/4074* (2013.01); *G11C 11/4096* (2013.01); *G11C 11/40622* (2013.01); *G11C 11/40626* (2013.01)

(58) Field of Classification Search
  CPC ................................................. G11C 11/40611
  See application file for complete search history.

(56) References Cited

U.S. PATENT DOCUMENTS

| | | |
|---|---|---|
| 2002/0018387 A1 | 2/2002 | Nam et al. |
| 2006/0002217 A1 | 1/2006 | Walker et al. |
| 2007/0140031 A1 | 6/2007 | Sako |
| 2009/0013127 A1* | 1/2009 | Atkinson ............. H04B 17/318 455/67.11 |
| 2014/0153350 A1* | 6/2014 | Boehm ............. G11C 11/40615 365/222 |
| 2015/0043284 A1* | 2/2015 | Sakuma ................... G11C 7/04 365/185.25 |
| 2016/0064063 A1* | 3/2016 | Nomura ............ G11C 11/40618 365/189.011 |
| 2020/0058348 A1 | 2/2020 | Belcourt et al. |
| 2020/0143880 A1* | 5/2020 | Sforzin ............... G06F 11/1068 |
| 2020/0258565 A1 | 8/2020 | Schaefer et al. |
| 2021/0020229 A1* | 1/2021 | Xie ...................... G11C 11/1675 |

OTHER PUBLICATIONS

PCT International Search Report and Written Opinion received for PCT Application No. PCT/US2022/039327, dated Nov. 21, 2022.

* cited by examiner

*Primary Examiner* — Min Huang
(74) *Attorney, Agent, or Firm* — Lowenstein Sandler LLP (57) ABSTRACT

A processing device of a memory sub-system is configured to determine a current refresh frequency associated with the memory device, the current refresh frequency specifying a rate of performing refresh operations on data stored at the memory device; compute an updated refresh frequency by updating the current refresh frequency based on a criterion reflecting a result of comparing one or more operating parameters of the memory device to their respective threshold values; and perform a refresh operation on data stored at the memory device according to the updated refresh frequency.

17 Claims, 7 Drawing Sheets

┌─────────────────────────────────────────────────────────────────────┐
│ DETERMINE A CURRENT REFRESH FREQUENCY ASSOCIATED WITH THE MEMORY    │
│ DEVICE, THE CURRENT REFRESH FREQUENCY SPECIFYING A RATE OF          │
│ PERFORMING REFRESH OPERATIONS ON DATA STORED AT THE MEMORY DEVICE   │
│                               510                                   │
└─────────────────────────────────────────────────────────────────────┘
                                  │
                                  ▼
┌─────────────────────────────────────────────────────────────────────┐
│ COMPUTE AN UPDATED REFRESH FREQUENCY BY UPDATING THE CURRENT        │
│ REFRESH FREQUENCY BASED ON A CRITERION COMPRISING COMPARING ONE OR  │
│ MORE OPERATING PARAMETERS OF THE MEMORY DEVICE TO THEIR RESPECTIVE  │
│                      THRESHOLD VALUES 520                           │
└─────────────────────────────────────────────────────────────────────┘
                                  │
                                  ▼
┌─────────────────────────────────────────────────────────────────────┐
│ PERFORM A REFRESH OPERATION ON DATA STORED AT THE MEMORY DEVICE     │
│      ACCORDING TO THE UPDATED REFRESH FREQUENCY  530                │
└─────────────────────────────────────────────────────────────────────┘
```

PERFORMING REFRESH OPERATIONS OF A MEMORY DEVICE ACCORDING TO A DYNAMIC REFRESH FREQUENCY

TECHNICAL FIELD

Embodiments of the disclosure relate generally to memory sub-systems, and more specifically, relate to performing refresh operations of a memory device according to a dynamic refresh frequency.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to performing refresh operations of a memory device according to a dynamic refresh frequency that is determined based on operating conditions of the memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by not-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a not-and (NAND) memory device. For some types of non-volatile memory devices (e.g., NAND devices), each plane consists of a set of physical blocks. A "block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows the establishment of multiple threshold voltage levels corresponding to different logical levels, thus effectively allowing a single memory cell to store multiple bits of information: a memory cell operated with "2n" different threshold voltage levels is capable of storing "n" bits of information. Thus, the read operation can be performed by comparing the measured voltage exhibited by the memory cell to one or more voltage demarcation levels (VDM)s in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage changes rapidly at first (immediately after the memory cell was programmed), and then slows down in an approximately logarithmic linear fashion with respect to the time elapsed since the cell programming event. Additionally, higher temperature of the memory device causes the temporal voltage shirt to accelerate even further. Accordingly, failure to mitigate the temporal voltage shift caused by the slow charge loss can result in the increased bit error rate in read operations.

Some implementations of memory sub-systems can periodically perform refresh operations at fixed time intervals. A refresh operation involves a series of operations for reading data stored at a set of memory cells of a memory component and re-writing the data back to the same memory cells. Because the data is read for the refresh operation on a periodic basis at a fixed time period, the conventional memory sub-system can minimize the time gap between subsequent refresh operations, thus minimizing the temporal voltage shift and enabling more efficient read operations. However, the rate of change of the temporal voltage shift can vary across dies. Additionally, operating conditions of the memory device, including the VDM retry rate, temperature, and throughput, can also affect the rate of change of the temporal voltage shift.

Aspects of the present disclosure address the above and other deficiencies by providing a memory sub-system that dynamically adjusts a frequency of a refresh operation of a memory device of the memory sub-system based on operating conditions of the memory device, such as the temperature of the memory device operating environment, the throughput of the memory device, and/or the voltage demarcation level (VDM) retry rate of the memory device. In certain embodiments, the throughput of the memory device refers to the amount of data processed by read operations and/or write operations of the memory device. The VDM retry rate may refer to the repeat rate of read operations of a block of the memory device using a different VDM value at each iteration, in order to minimize the error recovery flow (ERF) of the read operations. In this case, an efficient read operation would correspond to a low VDM retry rate of the memory device. In one embodiment, a refresh operation of the memory device can refer to a process of reading data stored at a given block of the memory device and then writing the same data back to the same block, thus resetting the threshold voltage of the corresponding memory cells.

In an embodiment, an initial refresh frequency for performing refresh operations on the memory device can be determined by a processing logic. The initial refresh frequency specifies a rate of performing the refresh operations on data stored at the memory device (e.g., perform a refresh operation every three hours). As an example, the initial refresh frequency can be determined during the post-manufacturing process of the memory device. In certain embodiments, a process of dynamically updating the refresh frequency can be performed by the processing logic periodically during the life time of the memory device to reflect changes in certain operating conditions including temperature of the memory device, throughput of the memory device and the VDM retry rate of the memory device. Updating the refresh frequency based on the changing operating conditions can result in a significantly improved performance.

In an embodiment, an updated refresh frequency can be computed by performing a set of update steps, such that the initial refresh frequency can be updated in each step based on a corresponding operating condition. When the set of update steps have been performed, the resulting updated refresh frequency can be used to perform refresh operations on data stored at the memory device until a new refresh frequency is computed and so on. In one embodiment, at a first update step of a series of three steps, the VDM retry rate of the memory device can be determined. For example, the VDM retry rate can be retrieved from a metadata table of the memory device where an average VDM retry rate of memory cells of the memory device is stored. The VDM retry rate can then be compared to a retry rate threshold that can be determined based on characteristics of the memory device. If the VDM retry rate is higher than the retry rate threshold, the initial refresh frequency can be updated based on the difference between the VDM retry rate and the retry rate threshold. As an example, a predefined look-up table can be used for determining the updated refresh frequency corresponding to a certain range of VDM retry rate. The updated refresh frequency can then be considered the output of the first update step. The processing logic can then proceed to perform the second update step of the refresh frequency of the memory device.

In certain embodiments, the updated refresh frequency of the first update step can be used as an input to the second update step. In the second update step, a throughput of the memory device can be determined. As an example, the throughput of the memory device can be retrieved from a throughput sensor that is connected to or embedded within the memory device. The value of the throughput can then be compared to a throughput threshold. If the throughput of the memory device is higher than the throughput threshold, the updated refresh frequency from the first update step can be reduced by a certain factor, such that the refresh operations can be performed less frequently given that the throughput of the memory device is high. On the other hand, if the throughput of the memory device is below the throughput threshold, the updated refresh threshold can be maintained without changes. In an implementation, the throughput threshold can be determined based on characteristics of the memory device. The resulting refresh frequency can then be delivered as an output of the second update step. The processing logic can then proceed to perform the third update step of the refresh frequency of the memory device.

In certain embodiments, the updated refresh frequency from the second update step can be used as an input to the third update step. In the third update step, the temperature of the memory device can be determined. As an example, the temperature of the memory device can be retrieved from a temperature sensor connected to or embedded within the memory device. The temperature of the memory device can then be compared to a temperature threshold. If the temperature of the memory device is higher than the temperature threshold, the updated refresh frequency from the second update step can be increased by a certain factor, such that the refresh operations can be performed more frequently at higher temperatures of the memory device. As an example, the updated refresh frequency can be increased by a certain amount for each increase of 10 degree centigrade in the temperature of the memory device. On the other hand, if the temperature of the memory device is below or equal to the temperature threshold, the updated refresh threshold from the second update step can be maintained without changes. The resulting refresh frequency can then be delivered as an output of the third update step.

In certain embodiments, the resulting refresh frequency can then be stored at a storage location of the memory device. Refresh operations of the memory device can be performed according to the stored refresh frequency until a new refresh frequency is determined. For example, when a stored refresh frequency is 5 hours, a refresh operation can be performed on data stored at the memory device every 5 hours, for example within a dedicated thread that runs the refresh operations periodically. When the refresh frequency is updated at a certain point in time in the future to 3 hours, due to changing operating conditions, a refresh operation can be performed on data stored at the memory device every 3 hours from that point in time onward, and so on.

Advantages of the present disclosure include, but are not limited to, efficiently computing a refresh frequency of a memory device of a memory sub-system based on operating condition of the memory device. Because the memory sub-system dynamically computes the refresh frequency of memory devices, the memory sub-system can accommodate the variations in the operating conditions of each memory device including VDM retry rate, throughput, and temperature of the memory device. Accordingly, the memory sub-system can minimize potential performance penalties of performing refresh operations of the memory device at a static rate without considering die to die variations of voltage temporal shift.

Figure 1:
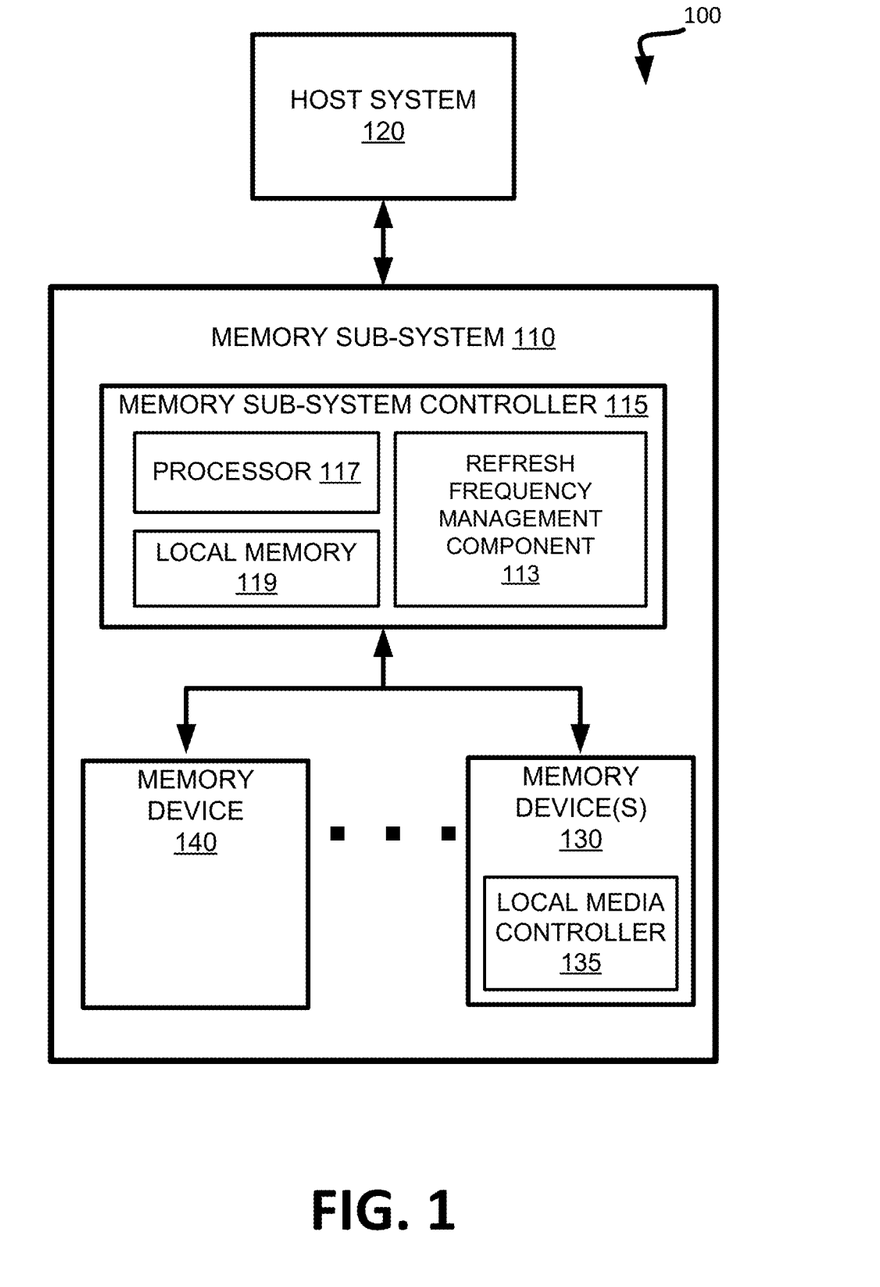
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory devices such as 3D cross-point type and NAND type memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), not-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes refresh frequency management component 113 that can dynamically adjusts a frequency of a refresh operation of a memory device 130-140 of the memory sub-system 110 based on operating conditions of the memory device 130-140 such as a temperature of the memory device operating environment, a throughput of the memory device, and/or a voltage demarcation level (VDM) retry rate of the memory device.

In an implementation, refresh frequency management component 113 can determine an initial refresh frequency for performing refresh operations on memory device 130-140. The initial refresh frequency specifies a rate of performing the refresh operations on data stored at the memory device (e.g., perform a refresh operation every three hours). In certain implementations, refresh frequency management component 113 can execute a process of dynamically updating the refresh frequency periodically during the life time of memory device 130-140, to reflect changes in certain operating conditions including temperature of memory device 130-140, throughput of memory device 130-140 and VDM retry rate of memory device 130-140.

In an implementation, refresh frequency management component 113 can compute an updated refresh frequency by performing a set of update steps, such that the initial refresh frequency is updated in each step based on a corresponding operating condition. When the set of update steps have been performed, refresh frequency management component 113 can use the resulting updated refresh frequency to perform refresh oppressions on data stored at the memory device until a new refresh frequency is computed and so on. In one implementation, refresh frequency management component 113, at a first update step, can update the refresh frequency based on a VDM retry rate of the memory device by comparing the VDM retry rate with a retry rate threshold. If the VDM retry rate is higher than the retry rate threshold, refresh frequency management component 113 can update the initial refresh frequency based on the difference between the VDM retry rate and the retry rate threshold. At a second update step, refresh frequency management component 113 can use the updated refresh frequency from the first update step as an input to the second update step. Refresh frequency management component 113 can then further update the refresh frequency of the memory device based on a throughput of the memory device. If the throughput of the memory device is higher than a predetermined throughput threshold, refresh frequency management component 113 can update the refresh frequency from the first update step based on the throughput of the memory device.

In certain implementations, refresh frequency management component 113 can use the refresh frequency from the second update step as an input to a third update step. In the third update step, refresh frequency management component 113 can further update the refresh frequency based on a temperature of the memory device. At a third update step, refresh frequency management component 113 can use the updated refresh frequency from the second update step as an input to the third update step. Refresh frequency management component 113 can then further update the refresh frequency of the memory device based on the temperature of the memory device. If the temperature of the memory device is higher than a predetermined temperature threshold, refresh frequency management component 113 can update the refresh frequency from the second update step based on the temperature of the memory device. Refresh frequency management component 113 can then deliver the resulting refresh frequency as an output of the third update step and can further store the resulting update frequency to be used for performing refresh operations of the memory device, as explained in more details herein.

Figure 2A:
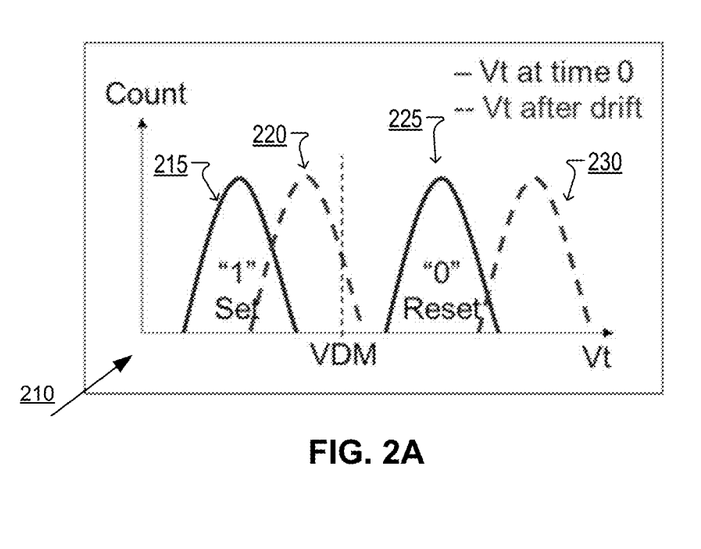
FIG. 2A illustrates the temporal voltage shift caused at least in part by the slow charge loss (SCL) exhibited by memory cells, in accordance with embodiments of the disclosure.

FIG. 2A illustrates the temporal voltage shift caused at least in part by the slow charge loss (SCL) exhibited by memory cells, in accordance with embodiments of the disclosure. While the illustrative example of FIG. 2A utilizes a single level cell, the same observations can be made and, accordingly, the same remedial measures are applicable to multiple level cells.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Chart 210 illustrates program voltage distributions 215, 225 (also referred to as "program distributions" or "voltage distributions" or "distributions" or "levels" herein) of memory cells programmed by a respective write level (which can be assumed to be at the midpoint of the program distribution) to encode a corresponding logical level. The program distributions 215, 225 can illustrate the range of threshold voltages (e.g., normal distribution of threshold voltages) for memory cells programmed at respective write levels (e.g., program voltages). In order to distinguish between adjacent program distributions (corresponding to two different logical levels), a voltage demarcation level (VDM) is defined, such that any measured voltage that falls below the VDM is associated with one program distribution of the pair of adjacent program distributions, while any measured voltage that is greater than or equal to the VDM is associated with another program distribution of the pair of neighboring distributions. In this case, program distribution 215 that is below the VDM can be interpreted as having a value of 1, while program distribution 225 that is above the VDM can be interpreted as having a value of 0.

Time After Program (TAP) herein shall refer to the time since a cell has been written and is the primary driver of TVS (temporal voltage shift). TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP.

As TAP of a certain cell increases over time, the program distributions change due primarily to slow charge loss. Accordingly, after a certain TAP, program distribution 215 can shift to program distribution 220. Similarly, program distribution 225 can shift to program distribution 230. In order to reduce the read bit error rate due to the shift in program distributions, the memory cell can be refreshed periodically in order to reset the program distributions and minimize shifts that may have occurred. In an implementation, refreshing the memory cell can be accomplished by reading data stored at the cell and then writing the data back to the cell.

Figure 2B:
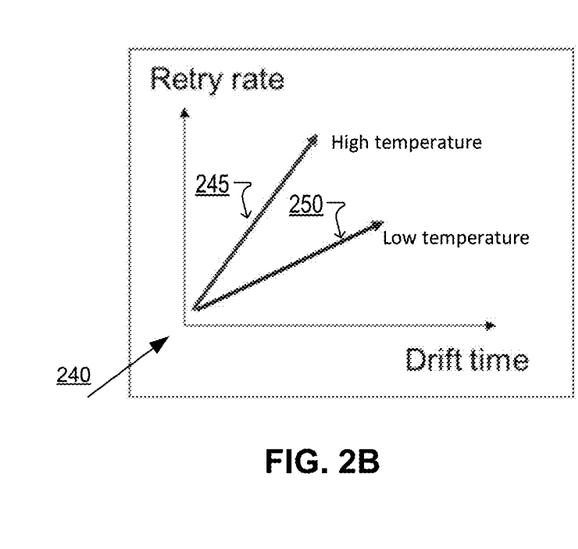
FIG. 2B illustrates the impact of operational temperature of the memory cell on the rate of read retries over time, in accordance with embodiments of the disclosure.

FIG. 2B illustrates the impact of the operational temperature of the memory cell on the rate of read retries over time, in accordance with embodiments of the disclosure. In various embodiments of the disclosure, the operational temperature of a group of die of the memory cell can cause a higher rate of read retry compared to a rate of read retries at a lower operational temperature. Plot 250 shows a rate of increase in retry rates as drift time of the memory cell increases when the operational temperature of the memory cell is low. On the other hand, plot 245 illustrates another rate of increase in retry rates as drift time of the memory cell increases when the operational temperature of the memory cell is high. As illustrated by plot 245 and plot 250, the rate of increase in read retry rate can be significantly higher when the operational temperature is high. Accordingly, taking the operational temperature of the memory device in consideration when computing a refresh rate of the memory device can be desirable in order to determine an efficient refresh rate of the memory device.

Figure 3:
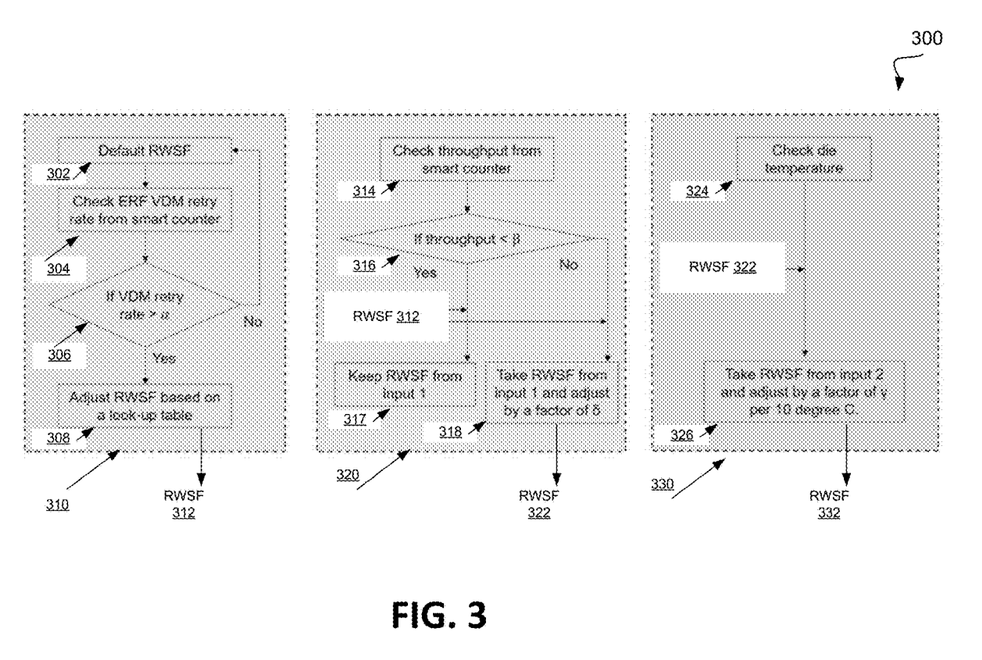
FIG. 3 is a flow diagram of an example method to dynamically adjust a frequency of a refresh operation of a memory device of the memory sub-system based on operating conditions of the memory device, in accordance with some embodiments of the present disclosure.

FIG. 3 is a flow diagram of an example method 300 to dynamically adjust a frequency of a refresh operation of a memory device of the memory sub-system based on operating conditions of the memory device, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by refresh frequency management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In an implementation, refresh frequency update step 310 can be performed in order to adjust a current refresh frequency of a memory device based on a VDM retry rate of the memory device. At operation 302, the processing logic can retrieve a current refresh frequency (e.g., a previously determined read write scrub frequency (RWSF)) from a certain storage location storing the operational metadata of the memory device. In an implementation, RWSF can refer to a refresh frequency of the memory device be performing a read operation followed by a write operation of memory cells of the memory device. At operation 304, the processing logic can read the current VDM retry rate from a certain location of the memory device, e.g., from a specific field of a metadata table of the memory device.

At operation 306, the processing logic can determine whether the VDM retry rate is greater than a specific retry rate threshold "a". As an example, the retry rate threshold a can be a value within a range of 1E-6 to 1E-2 that is determined based on the characteristics and specifications of the memory device. If the VDM retry rate is greater than a, the processing logic, at operation 308, can adjust the refresh frequency based on a corresponding value from a look-up table that is maintained in the memory device, such that entries of the look up table are computed based on the characteristics of the memory device. As an example, the look-up table can have a refresh frequency value of 4 hours for a retry rate of 1E-1, a refresh frequency of 5 hours for a retry rate of 1E0, and so on. On the other hand, if the VDM retry rate is less than a, the processing logic can keep the current refresh frequency without modification. The processing logic then can utilize the output refresh frequency 312 as an input to the next update step 320.

At operation 314, the processing logic can read a current throughput of the memory device from a dedicated memory region of the memory device. As an example, the processing logic can read the throughput value from a throughput sensor attached to the memory device. At operation 316, the processing logic can determine whether the throughput value is less than a specific throughput threshold "B". As an example, the throughput threshold B can be a value within a range of 1E0 to 1E-6 gigabit per second. If the throughput of the memory device is less than B, the processing logic at operation 317 can keep refresh frequency 312 from update step 310 without further modifications. On the other hand, at operation 318, if the throughput of the memory device is greater than or equal to B, the processing logic can adjust refresh frequency 312 by a factor of 6. In an illustrative example, the processing logic can increase the refresh frequency by a factor of 10% for every decrease of 10 gigabit per second between the throughput of the memory device and the threshold B. The processing logic then can utilize the output refresh frequency 322 as an input to the next update step 330.

At operation 324, the processing logic can read a current internal temperature of the memory device from a dedicated memory region of the memory device. As an example, the processing logic can retrieve the temperature of a specific die of the memory device from a temperature sensor attached to the memory device. At operation 326, the processing logic can compare the temperature of the memory device to a temperature threshold. If the temperature of the memory device is higher than the temperature threshold, the processing logic can adjust refresh frequency 322 from update step 320, such that refresh frequency 322 is increased by a corresponding factor Y when the temperature of the memory device is high. For example, refresh frequency 322 can be increased by a certain amount Y, that is determined based on characteristics of the memory device, for each increase of 10 degree centigrade in the temperature of the memory device. The processing logic can output the adjusted refresh frequency 332 and can store refresh frequency 332 at a dedicated memory location to be used for determining the frequency of performing refresh operations of the memory device.

Figure 4:
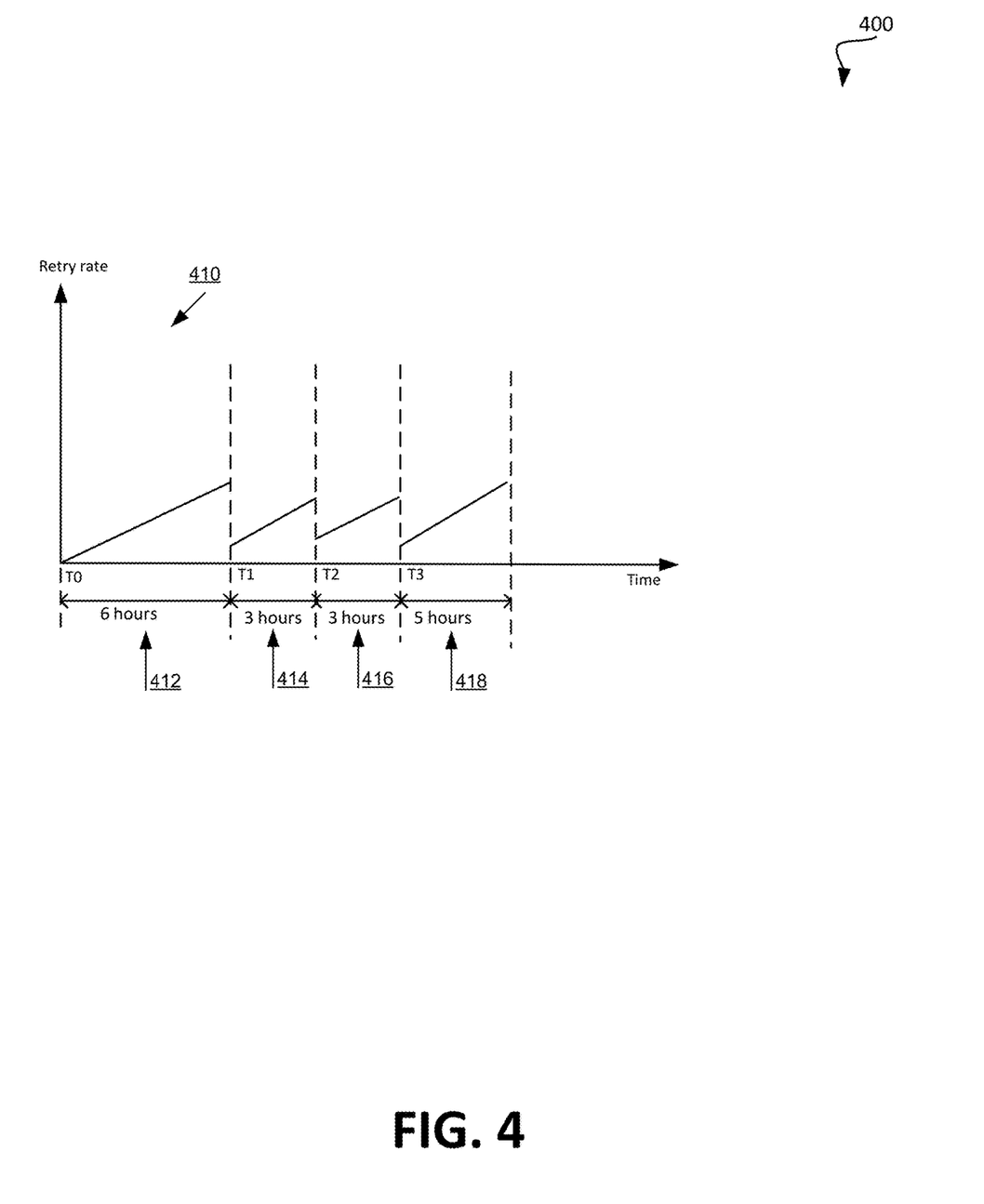
FIG. 4 illustrates an example method of utilizing a dynamic refresh frequency in performing refresh operations of the memory device, in accordance with embodiments of the disclosure.

FIG. 4 illustrates an example method of utilizing a dynamic refresh frequency in performing refresh operations of the memory device, in accordance with embodiments of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by refresh frequency management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Chart 410 illustrates a rate of change of the read retry rate of memory cells of a memory device (e.g., memory device 130-140 of memory sub-system 110 of FIG. 1) over time. At time T0, the processing logic computes a refresh frequency 412 of 6 hours for performing refresh operations of the memory device. As an example, the processing logic can utilize the steps illustrated in FIG. 3 to compute the refresh frequency 412. The processing logic can wait for a period of 6 hours to perform a next refresh operation.

At time T1, the processing logic executes a refresh operation and computes new refresh frequency 414 for performing the next refresh operation. In implementations, the processing logic computes refresh frequency 414 based on operating conditions of the memory device including temperature, throughput, and VDM retry rate of the memory device, as explained in more details herein above. The processing logic then waits for a period of refresh frequency 414 (e.g., 3 hours) before executing the next refresh operation and computing a new refresh frequency. While the processing logic computes a new refresh frequency at the time of performing a refresh operation. in other implementations, the processing logic can computer the new refresh frequency at a different time that is independent of the performance of the refresh operation of the memory device.

At time T2, and after the time determined by refresh frequency 414 has elapsed, the processing logic executes a refresh operation and computes a new refresh frequency 416 of 3 hours for performing the next refresh operation. In implementations, the processing logic computes refresh frequency 416 based on operating conditions of the memory device including temperature, throughput, and VDM retry rate of the memory device, as explained in more details herein above. The processing logic then waits for a period of refresh frequency 416 (e.g., 3 hours) before executing the next refresh operation and computing a new refresh frequency. In an illustrative example, the processing logic can perform the refresh operation and compute the refresh frequency within a dedicated background thread that executes the refresh operations and frequency calculations periodically.

At time T3, and after the time determined by refresh frequency 416 (e.g., 3 hours) has elapsed, the processing logic executes a refresh operation and computes a new refresh frequency 418 of 5 hours for performing the next refresh operation, based on certain operating conditions of the memory device, as explained n more details herein above. The processing logic then waits for a period of refresh frequency 418 (e.g., 5 hours) before executing the next refresh operation and computing a new refresh frequency. In an implementation, the processing logic can continue to perform refresh operations and dynamically calculate refresh frequency throughout the lifetime of the memory device.

Figure 5:
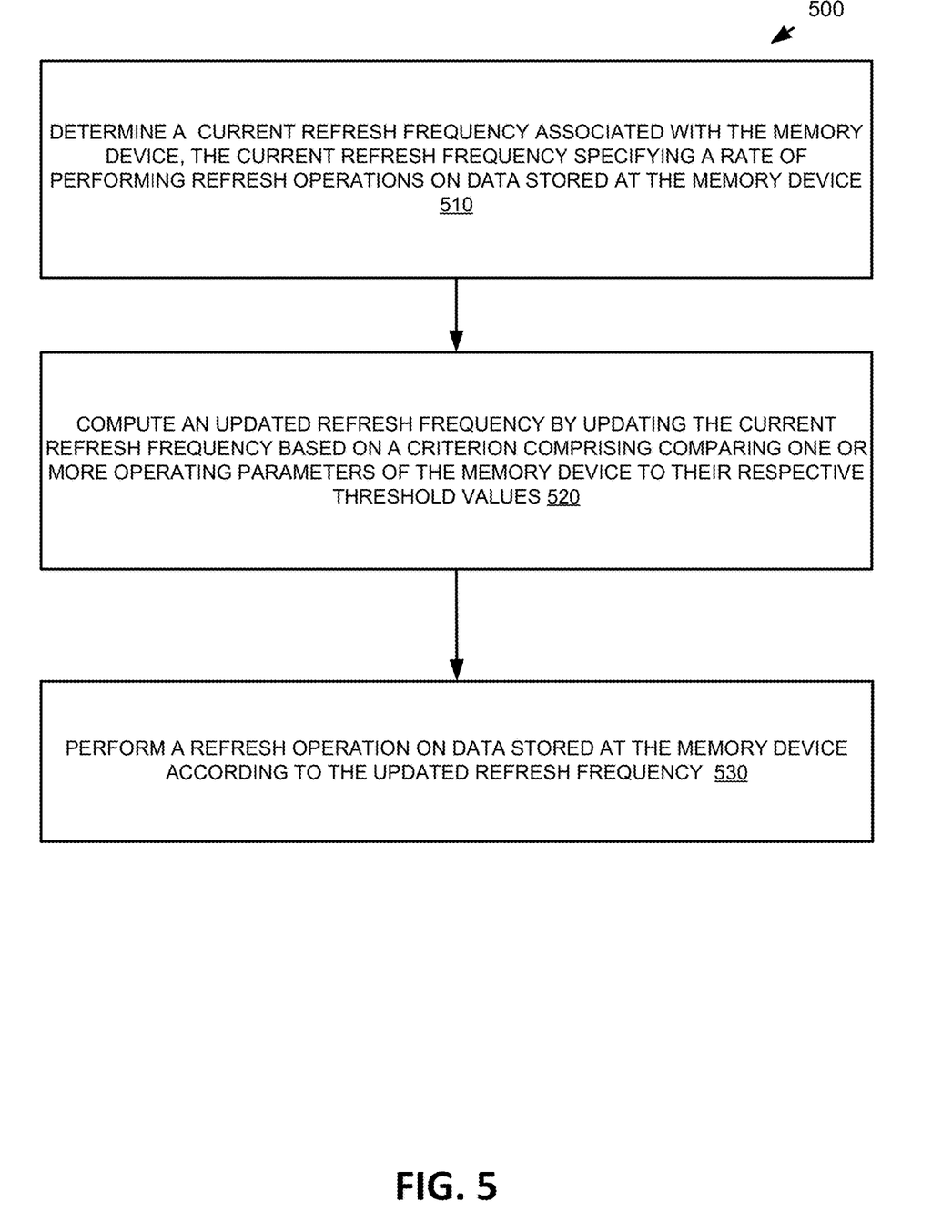
FIG. 5 is a flow diagram of an example method to perform a refresh operation on the memory device based on a dynamic refresh frequency that is determined based on operating conditions of the memory device, in accordance with some other embodiments of the present disclosure.

FIG. 5 is a flow diagram of an example method 500 to perform a refresh operation on the memory device based on a dynamic refresh frequency that is determined based on operating conditions of the memory device, in accordance with some other embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by refresh frequency management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic determines a current refresh frequency associated with the memory device (e.g., memory device 130 of FIG. 1). In an implementation, the current refresh frequency represents a rate of performing refresh operations on data stored at the memory device. In an implementation, performing a refresh operation include reading data stored at a memory cell of the memory device and writing the data back to the memory cell of the memory device, thus resetting the threshold voltage of the corresponding memory cells and significantly reducing any shift in the threshold voltage that is required for an efficient read operation of contents of a memory cell, as explained in more details herein above.

At operation 520, the processing logic computes an updated refresh frequency by updating the current refresh frequency based on operating conditions of the memory device. In certain implementations, the processing logic performs multiple update steps to update the current refresh frequency based on one operating condition at each step, as explained in more details herein above. The operating conditions include a VDM refresh rate of the memory device, a throughput of the memory device, and a temperature of the memory device. In an implementation, the processing logic updates the refresh frequency if each of the operating conditions satisfies a corresponding predetermined threshold, as explained in more details above.

At operation 530, the processing logic perform a refresh operation on data stored at the memory device according to the updated refresh frequency. In certain implementations, the processing logic executes a background thread to perform a refresh operation according to the refresh frequency, e.g., by executing a refresh operation then waiting for a period of time corresponding to the refresh frequency before executing the next refresh operation, and so on.

Figure 6:
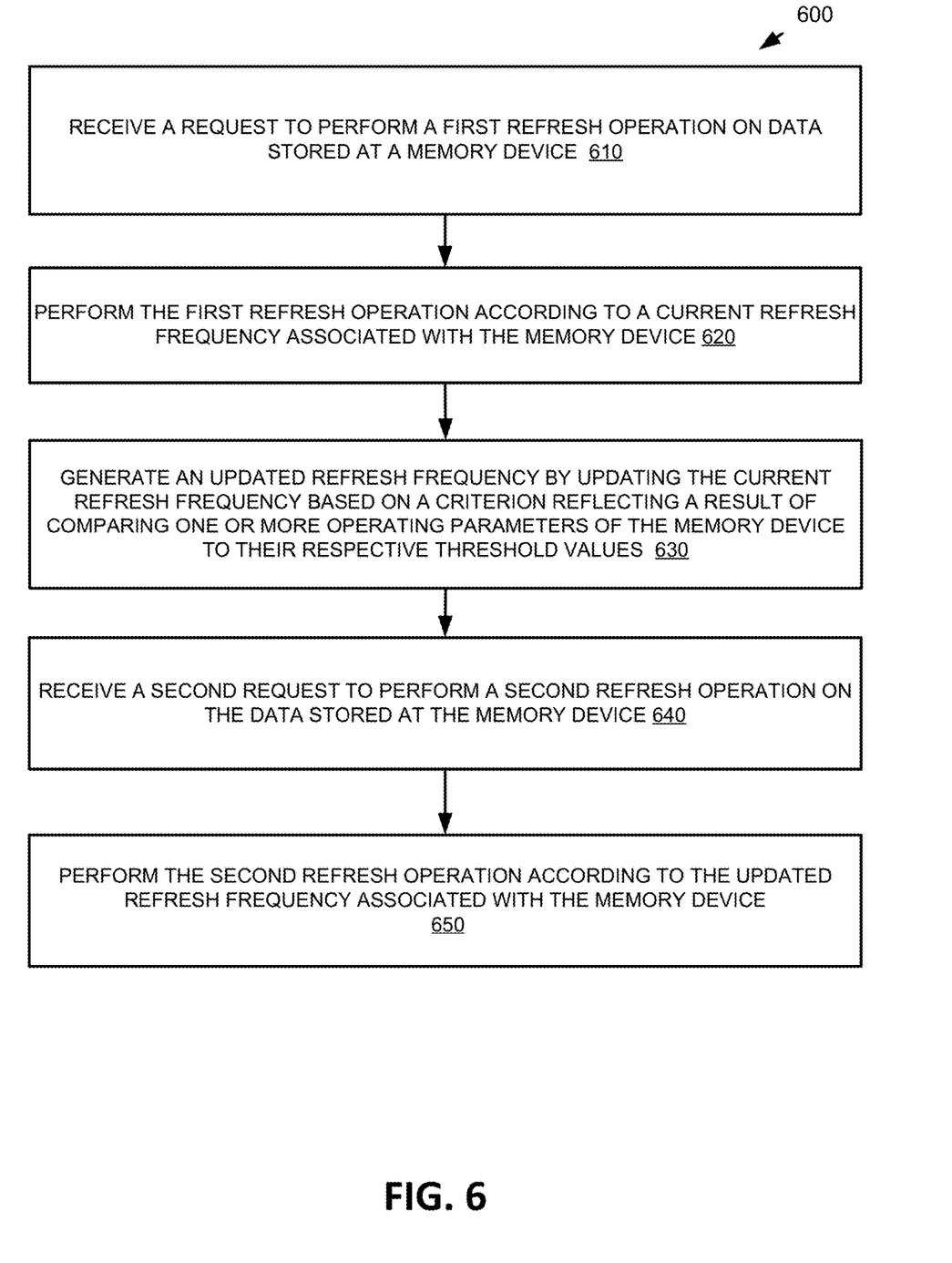
FIG. 6 is a flow diagram of an example method to perform refresh operations on the memory device based on dynamic refresh frequencies, in accordance with some other embodiments of the present disclosure

FIG. 6 is a flow diagram of an example method 600 to perform refresh operations on the memory device based on dynamic refresh frequencies, in accordance with some other embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by refresh frequency management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a request to perform a refresh operation on data stored at a memory device 130. In an implementation, the request to perform a refresh operation can be initiated as a result of a predetermined schedule for performing refresh operations of the memory device. In other implementations, the request to perform the refresh operation can be initiated as a result of a determination that a shift of the threshold voltage of the memory device exceeded a certain threshold. In some implementation, the request to perform the refresh operation can be received form a background thread of the memory device, as explained herein above.

At operation 620, the processing logic executes the request by performing the refresh operation according to a current refresh frequency of the memory device. In an implementation, the current refresh frequency can be determined as a default value during a provisioning process of the memory device (e.g., the provisioning process can be performed as a one time process post manufacturing of the memory device).

At operation 630, the processing logic generates an updated refresh frequency by updating the current refresh frequency based on operating conditions of the memory device. In certain implementations, the processing logic performs multiple update steps to update the current refresh frequency based on one operating condition at each step, as explained in more details herein above. The operating conditions include a VDM refresh rate of the memory device, a throughput of the memory device, and a temperature of the memory device. In an implementation, the processing logic updates the refresh frequency if each of the operating conditions satisfies a corresponding predetermined threshold, as explained in more details above.

At operation 640, the processing logic receives another request to perform a subsequent refresh operation on data stored at a memory device 130. In an implementation, the other request to perform the subsequent refresh operation can be received form a background thread of the memory device, as explained herein above.

At operation 650, the processing logic perform the subsequent refresh operation on data stored at the memory device according to the updated refresh frequency. In certain implementations, the processing logic executes a background thread to perform the subsequent refresh operation according to the refresh frequency, as explained in more details herein above.

Figure 7:
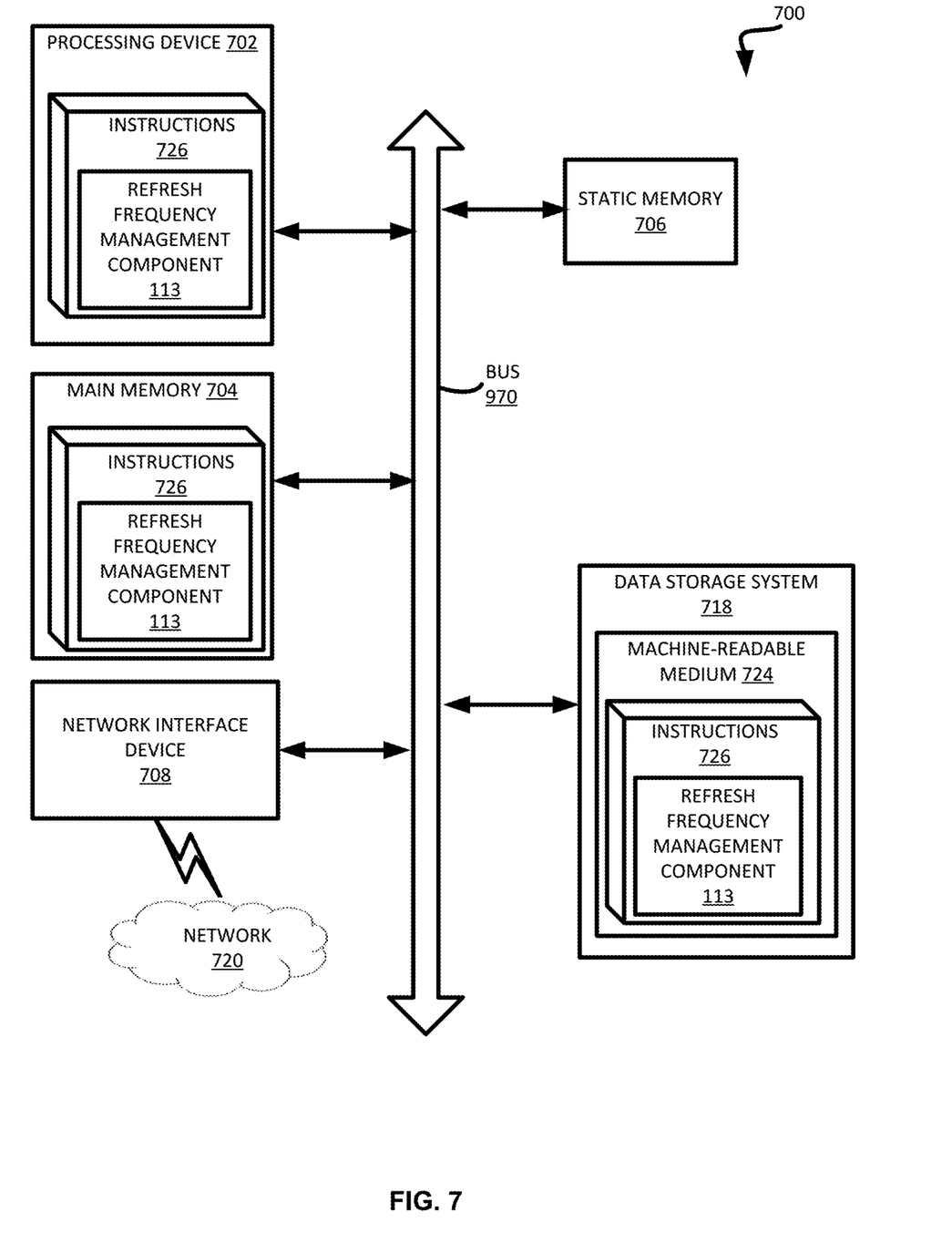
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to refresh frequency management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a refresh operation component (e.g., refresh frequency management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
determining a current refresh frequency associated with the memory device, the current refresh frequency specifying a rate of performing refresh operations on data stored at the memory device;
computing an updated refresh frequency by updating the current refresh frequency based on a criterion reflecting a result of comparing one or more operating parameters of the memory device to their respective threshold values, wherein the one or more operating parameters comprise at least a voltage demarcation level (VDM) retry rate of the memory device; and
performing a refresh operation on data stored at the memory device according to the updated refresh frequency.

2. The system of claim 1, wherein computing the updated refresh frequency further comprises:
updating the current refresh frequency based on a first criterion corresponding to a first operating parameter of the memory device, to generate a second refresh frequency;

updating the second refresh frequency based on a second criterion corresponding to a second operating parameter of the memory device, to generate a third refresh frequency; and updating the third refresh frequency based on a third criterion corresponding to a third operating parameter of the memory device, to generate the updated refresh frequency.

3. The system of claim 1, wherein updating the current refresh frequency further comprises:

responsive to detecting that a VDM retry rate of the memory device is higher than a retry rate threshold, increasing the current refresh frequency.

4. The system of claim 1, wherein the one or more operating parameters comprise a throughput of the memory device.

5. The system of claim 4, wherein updating the current refresh frequency further comprises:

responsive to detecting that a throughput of the memory device is higher than a throughput threshold, decreasing the current refresh frequency.

6. The system of claim 1, wherein the one or more operating parameters comprise a temperature of the memory device.

7. The system of claim 1, wherein updating the current refresh frequency further comprises:

responsive to detecting that a temperature of the memory device is higher than a temperature threshold, increasing the current refresh frequency associated with the memory device.

8. The system of claim 1, wherein performing the refresh operation further comprises:

performing a read operation of data stored at a block of the memory device; and performing a write operation to write the data back to the block of the memory device.

9. A method comprising:

receiving a request to perform a first refresh operation on data stored at a memory device;

performing the first refresh operation according to a current refresh frequency associated with the memory device;

generating an updated refresh frequency by updating the current refresh frequency based on a criterion reflecting a result of comparing one or more operating parameters of the memory device to their respective threshold values, wherein the one or more operating parameters comprise at least a voltage demarcation level (VDM) retry rate of the memory device;

receiving a second request to perform a second refresh operation on the data stored at the memory device; and performing the second refresh operation according to the updated refresh frequency associated with the memory device.

10. The method of claim 9, wherein updating the current refresh frequency further comprises:

responsive to detecting that a VDM retry rate of the memory device is higher than a retry rate threshold, increasing the current refresh frequency associated with the memory device.

11. The method of claim 9, wherein the one or more operating parameters comprise a throughput of the memory device.

12. The method of claim 9, wherein updating the current refresh frequency further comprises:

responsive to detecting that a throughput of the memory device is higher than a throughput threshold, decreasing the current refresh frequency associated with the memory device.

13. The method of claim 9, wherein the one or more operating parameters comprise a temperature of the memory device.

14. The method of claim 13, wherein updating the current refresh frequency further comprises:

responsive to detecting that a temperature of the memory device is higher than a temperature threshold, increasing the current refresh frequency associated with the memory device.

15. A non-transitory computer-readable storage medium comprising instructions that, when executed by a processing device, cause the processing device to perform operations comprising:

determining a current refresh frequency associated with a memory device, the current refresh frequency specifying a rate of performing refresh operations on data stored at the memory device;

computing an updated refresh frequency by updating the current refresh frequency based on a criterion reflecting a result of comparing one or more operating parameters of the memory device to their respective threshold values, wherein the one or more operating parameters comprise at least one of a VDM retry rate of the memory device, a throughput of the memory device, or a temperature of the memory device; and performing a refresh operation on data stored at the memory device according to the updated refresh frequency.

16. The non-transitory computer-readable storage medium of claim 15, wherein computing the updated refresh frequency further comprises:

updating the current refresh frequency based on a first criterion corresponding to a first operating parameter of the memory device, to generate a second refresh frequency;

updating the second refresh frequency based on a second criterion corresponding to a second operating parameter of the memory device, to generate a third refresh frequency; and updating the third refresh frequency based on a third criterion corresponding to a third operating parameter of the memory device, to generate the updated refresh frequency.

17. The non-transitory computer-readable storage medium of claim 15, wherein performing the refresh operation comprises:

performing a read operation of data stored at a block of the memory device; and performing a write operation to write the data back to the block of the memory device.

* * * * *